(12) United States Patent
Park et al.

(10) Patent No.: US 11,170,975 B2
(45) Date of Patent: Nov. 9, 2021

(54) ION IMPLANTATION APPARATUS

(71) Applicant: XIA TAI XIN SEMICONDUCTOR (QING DAO) LTD., Qingdao (CN)

(72) Inventors: Heung-Woo Park, Singapore (SG); Hasung Lee, Singapore (SG); Jong-Moo Choi, Singapore (SG); Sung-Ki Kim, Singapore (SG)

(73) Assignee: XIA TAI XIN SEMICONDUCTOR (QING DAO) LTD., Qingdao (CN)

( * ) Notice: Subject to any disclaimer, the term of this patent is extended or adjusted under 35 U.S.C. 154(b) by 0 days.

(21) Appl. No.: 16/679,319

(22) Filed: Nov. 11, 2019

(65) Prior Publication Data
US 2020/0216946 A1 Jul. 9, 2020

Related U.S. Application Data

(60) Provisional application No. 62/773,203, filed on Nov. 30, 2018.

(51) Int. Cl.
*H01J 37/317* (2006.01)
*H01J 37/30* (2006.01)

(52) U.S. Cl.
CPC ..... *H01J 37/3171* (2013.01); *H01J 2237/022* (2013.01)

(58) Field of Classification Search
None
See application file for complete search history.

(56) References Cited

U.S. PATENT DOCUMENTS

| | | | |
|---|---|---|---|
| 5,656,092 A * | 8/1997 | Blake | H01J 37/3002 118/723 VE |
| 6,525,326 B1* | 2/2003 | Harrington | H01J 3/40 250/398 |
| 2005/0133736 A1* | 6/2005 | Chen | H01J 37/3171 250/492.21 |
| 2009/0095916 A1* | 4/2009 | Ryding | H01J 37/026 250/396 R |
| 2011/0012033 A1* | 1/2011 | Colvin | H01J 3/40 250/492.21 |
| 2013/0181139 A1* | 7/2013 | Eisner | H01J 37/3171 250/396 R |
| 2020/0098544 A1* | 3/2020 | Meng | H01L 21/26513 |

FOREIGN PATENT DOCUMENTS

KR   20060100739 A  *  9/2006  ............. G01N 27/62

* cited by examiner

Primary Examiner — Michael J Logie
(74) Attorney, Agent, or Firm — ScienBiziP, P.C.

(57) ABSTRACT

A collecting plate is disclosed. The collecting plate includes a body having a plurality of holes arranged in an array and a plurality of mitt members respectively disposed over the plurality of holes. The holes and the mitt members are configured to capture and store contaminant particle and prevent contaminant particles from entering processing chamber.

9 Claims, 7 Drawing Sheets

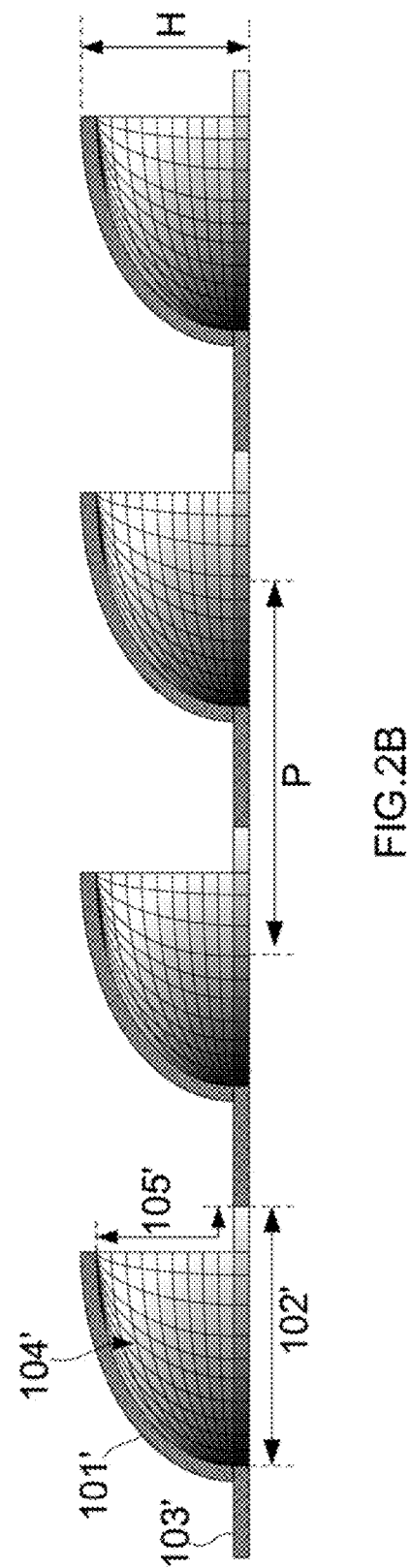

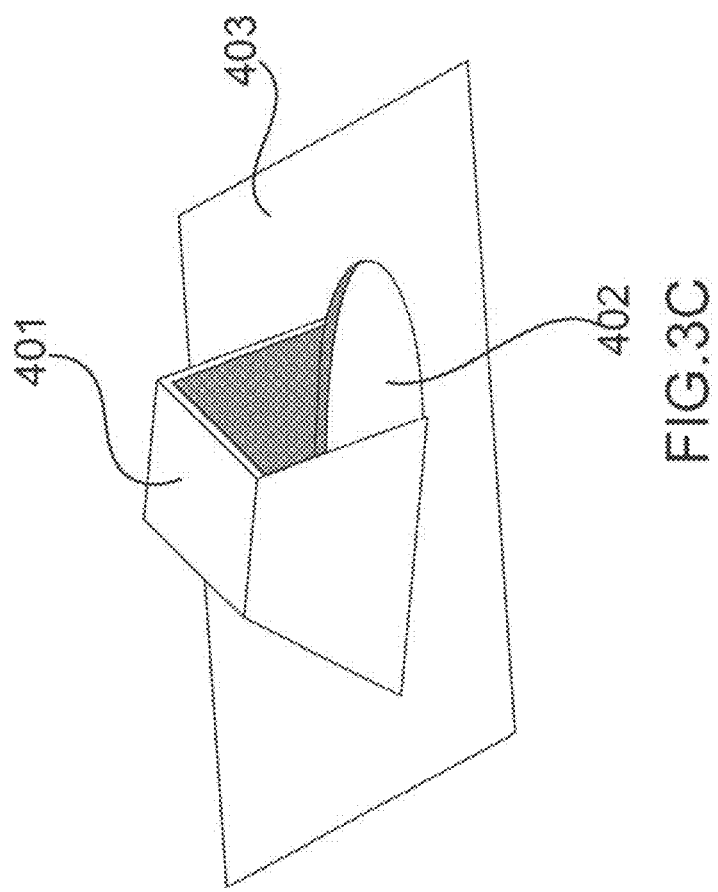

ION IMPLANTATION APPARATUS

CROSS-REFERENCES TO RELATED APPLICATIONS

This application claims the benefit of U.S. Provisional Patent Application No. 62/773,203 filed on Nov. 30, 2018, which is hereby incorporated by reference herein and made a part of specification.

BACKGROUND

1. Field

The present disclosure generally relates to ion implantation apparatus, and more particularly, ion implantation apparatus having collecting plate configured to capture contaminant particles.

2. Description of the Related Art

A collecting plate of an ion implantation apparatus must be compatible with the vacuum environment. Conventional collecting plate uses collecting surface, such as adhesives, porous materials, and oily materials, that tend to outgas substances in a vacuum environment, which makes them inappropriate for use.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B. illustrates a cross section along of a portion of a collecting plate according to some embodiments of the instant disclosure;

FIG. 3A-3C illustrates a portion of a collecting plate according to some embodiments of the instant disclosure.

DETAILED DESCRIPTION

Figure 1:
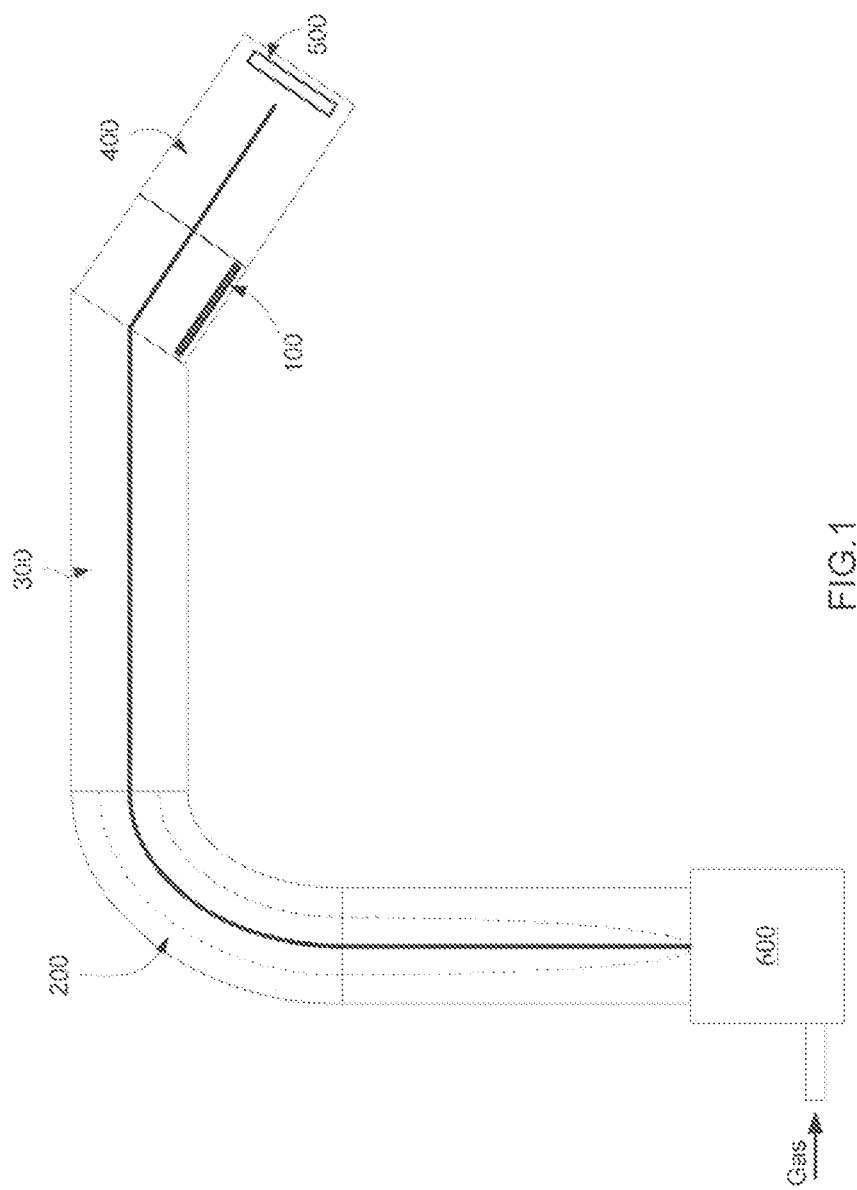
FIG. 1 illustrates a regional cross section view of ion implantation apparatus according to some embodiments of the instant disclosure.

The present disclosure will now be described more fully hereinafter with reference to the accompanying drawings, in which exemplary embodiments of the disclosure are shown. This disclosure may, however, be embodied in many different forms and should not be construed as limited to the exemplary embodiments set forth herein. Rather, these exemplary embodiments are provided so that this disclosure will be thorough and complete, and will fully convey the scope of the disclosure to those skilled in the art. Like reference numerals refer to like elements throughout.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," or "includes" and/or "including" or "has" and/or "having" when used herein, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 illustrates an ion implantation apparatus according to some embodiments of the instant disclosure. The ion implantation apparatus comprises an ion source 600, an analyzer 200 coupled to the ion source 600, an accelerator 300 coupled to the analyzer 200, a process chamber 400 configured to receive implant particles from the accelerator 300, and a collecting plate 100 disposed between the accelerator 300 and the process chamber 400. The ion source 600 is configured to generate a mixture of ions. The analyzer 200 is coupled to the ion source 600. The mixture of ions includes ions required by the ion implantation process. The dopant gases used to form the mixture of ions includes $AsH_3$, $BF_3$, $PH_3$, Co, $GeF_4$, Xe, $H_2$, $N_2$, Ar. The dopant gases may produce contaminant particles including carbon, iron, and tungsten. The analyzer 200 is configured to analyze the mixture of ions generated by the ion source 600 and select the ions required by the process from the mixture of ions. The accelerator 300 is coupled to the ion analyzer 200. The accelerator 300 is configured to accelerate the speed of the selected ions to ensure penetration of into the substrate 500. The collecting plate 100 is removable from the ion implantation apparatus. The collecting plate 100 have a plurality of pocket openings. Each of the plurality of pocket openings being formed by a hole on a body of the collecting plate and a mitt member partially covering the hole. The hole and the mitt member forms a cavity. In some embodiments, a material for the collecting plate 100' is of non-metal conductive material, such as graphite. The process chamber 400 is coupled to the accelerator 300 and is configured to hold the substrate 500. As shown in FIG. 1, the direction of the selected ions is changed to further ensure that only the selected ions are fed into the doping chamber 400 and implanted into the substrate 500.

Figure 2A:
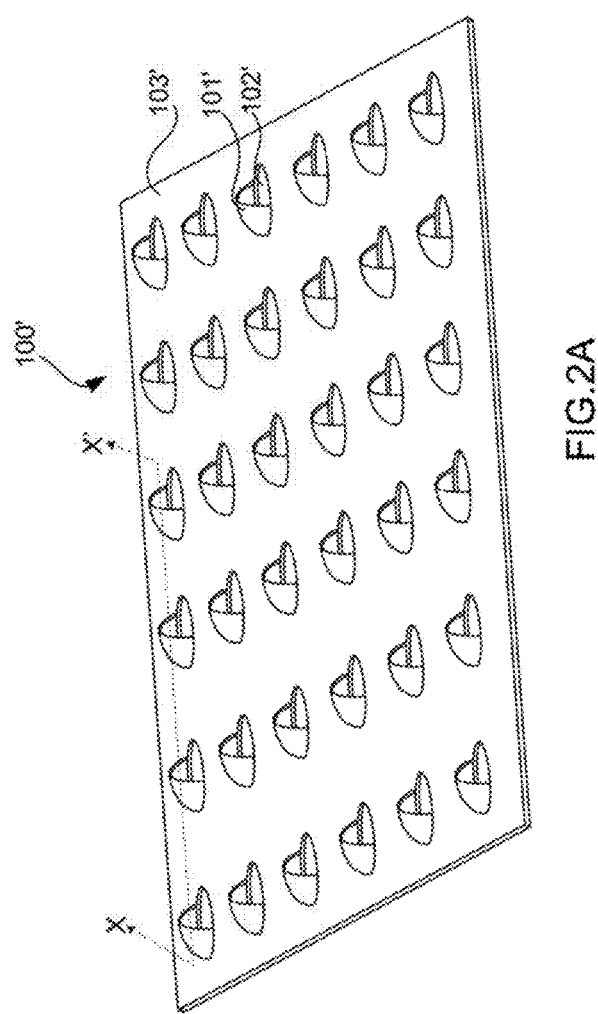
FIG. 2A illustrates a portion of a collecting plate according to some embodiments of the instant disclosure.

FIG. 2A illustrates a portion of a collecting plate according to some embodiments of the instant disclosure. FIG. 2B. illustrates a cross section along X-X' of a portion of a collecting plate according to some embodiments of the instant disclosure. The collecting plate 100' includes a body 103' having a plurality of holes 102' arranged in an array and a plurality of mitt members 101' respectively disposed over the plurality of holes 102'. Each of the mitt members 101' partially covers a corresponding hole 102'. A space between an exposed periphery of the mitt member 101' and an exposed periphery of the hole 102' forms an pocket opening 105'. In some embodiments, the hole 102' and the mitt member 101' forms a cavity 104'. Contaminant particles may be ion particles from the mixture of ions generated by the ion source that are unwanted but managed to pass through the analyzer of the ion implantation apparatus. The contaminant particles may be travelling towards the collecting plate 100' and enters into the pocket openings 105' of the collecting plate 100' and moves into the cavity 104'. The cavity 104' is used to catch and store the contaminant particles. The mitt members 101' are configured to catch the contaminant particles traveling at a speed and directing the contaminant particles towards a corresponding hole 102'. In some embodiments, the mitt members 101' are designed to have narrowing cavities 104' to decrease the speed of the contaminant particles as it gets deeper into the cavity 104'. An internal wall of the mitt member 101' disposed within the cavity 104' may be used to guide the direction of the contaminant particles towards the corresponding hole 102'. The plurality of holes 102' are configured to retain contaminant particles.

In some embodiments, a cross sectional view of the mitt member 102' forms an arch shape and the mitt member has a half dome shape. In some embodiments, a thickness of the body 103' the collecting plate 100' ranges from about 10 mm to about 18 mm. A height H from a highest point of the mitt member 102' to a bottom surface of the body 103' of the collecting plate 100' ranges from about 3 mm to about 6 mm. A pitch P between neighboring holes 102' ranges from about 3 mm to about 10 mm. A width of the hole 102' ranges from about 3 mm to about 5 mm.

Figure 3A:
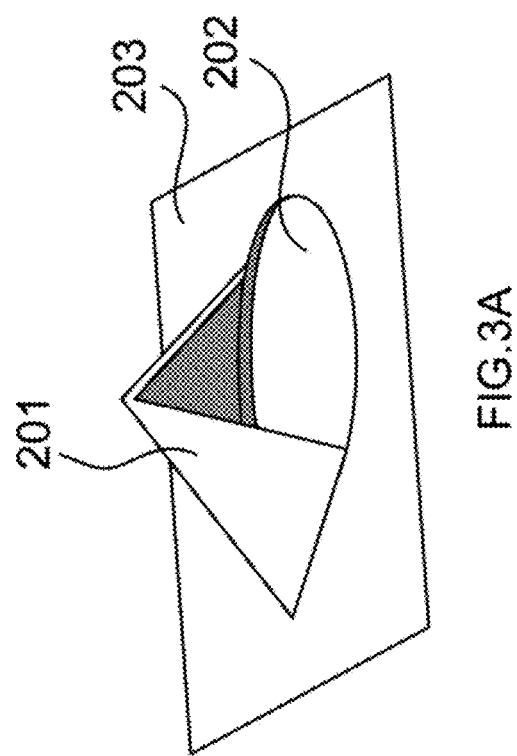
Figure 3B:
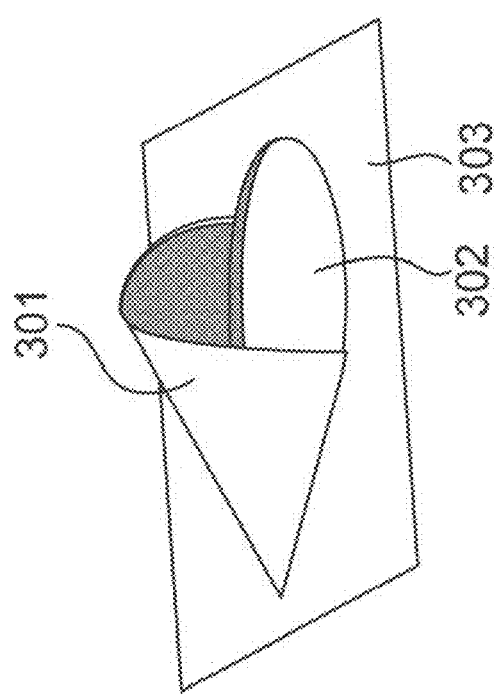

FIG. 3A-3C illustrates a portion of a collecting plate according to some embodiments of the instant disclosure. In FIG. 3A, a cross sectional view of the mitt member 201 forms a triangular shape and the mitt member 202 has a pyramidal shape. The sectional area of the mitt member 201 may be triangular in shape and may decrease gradually upon going further into the cavity and away from the pocket opening. The hole 202 may be teardrop shaped. The pattern of the hole 202 within the cavity may conform to the shape of formed by the periphery of the mitt member 201 in contact with the body while the pattern of the hole 202 outside the cavity may be rounded as shown in FIG. 3A. In some embodiments, a thickness of the body 203 the collecting plate ranges from about 10 mm to about 18 mm. A height from a highest point of the mitt member 201 to a bottom surface of the body 203 of the collecting plate ranges from about 3 mm to about 6 mm. A pitch between neighboring holes 202 ranges from about 3 mm to about 10 mm. A width of the hole 202 ranges from about 3 mm to about 5 mm.

In FIG. 3B, a cross sectional view of the mitt member 302 forms a triangular shape and the mitt member 301 has a conical shape. The sectional area of the mitt member 301 may be semi-circle in shape and may decrease gradually upon going further into the cavity and away from the pocket opening. The hole 302 may be teardrop shaped. The pattern of the hole 302 within the cavity may conform to the shape of formed by the periphery of the mitt member 301 in contact with the body while the pattern of the hole 302 outside the cavity may be rounded as shown in FIG. 3B. In some embodiments, a thickness of the body 303 the collecting plate ranges from about 10 mm to about 18 mm. A height from a highest point of the mitt member 301 to a bottom surface of the body 303 of the collecting plate ranges from about 3 mm to about 6 mm. A pitch between neighboring holes 302 ranges from about 3 mm to about 10 mm. A width of the hole 302 ranges from about 3 mm to about 5 mm.

In FIG. 3C, a cross sectional view of the mitt member forms a quadrangular shape and the mitt member has a box shape. The box shaped mitt member 401 may include four flat surfaces attached to each other along the corresponding edges. The sectional area of the mitt member 401 may be quadrilateral in shape and may stay substantially the same going further into the cavity and away from the pocket opening. In some embodiments, the sectional area may gradually decrease moving towards the end of the cavity. The hole 302 may be a quadrilateral shape having two adjacent corners rounded. The pattern of the hole 402 within the cavity may conform to the shape of formed by the periphery of the mitt member 402 in contact with the body while the pattern of the hole 402 outside the cavity may be rounded as shown in FIG. 3B. In some embodiments, a thickness of the body 403 the collecting plate ranges from about 10 mm to about 18 mm. A height from a highest point of the mitt member 401 to a bottom surface of the body 403 of the collecting plate ranges from about 3 mm to about 6 mm. A pitch between neighboring holes 402 ranges from about 3 mm to about 10 mm. A width of the hole 402 ranges from about 3 mm to about 5 mm.

Figure 4:
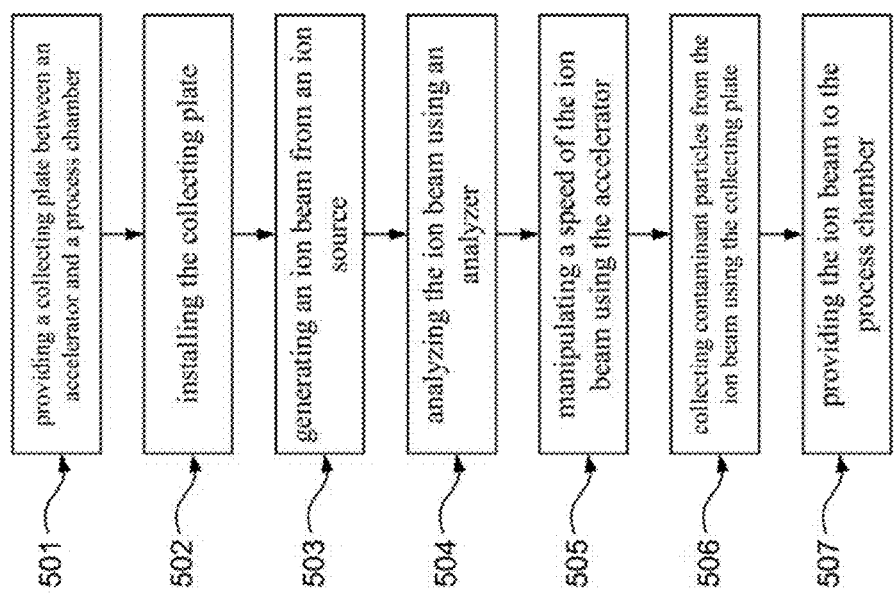
FIG. 4 illustrates a flowchart of a method of capturing contaminant particle according to some embodiments of the instant disclosure.

FIG. 4 illustrates a flowchart of a method of capturing contaminant particle according to some embodiments of the instant disclosure. The method of capturing contaminant particle that includes receiving a collecting plate (501), installing the collecting plate (502), generating an ion beam from an ion source (503), analyzing the ion beam using an analyzer (504), manipulating a speed of the ion beam using the accelerator (505), collecting contaminant particles from the ion beam using the collecting plate (506), and providing the ion beam to the process chamber (507). The collecting plate has a plurality of pocket openings. Each of the plurality of pocket openings is formed by a hole on a body of the collecting plate and a mitt member partially covering the hole. The ion beam is moving in a direction towards the plurality of pocket openings of the collecting plate. The contaminant particles of the ion beam then enters the pocket opening of the collecting plate and moves towards the cavity formed by the mitt member. The mitt member is configured to lower the speed of the contaminant particles. Furthermore, the mitt member may act as a guide to the contaminant particles to move towards and be collected into the hole of the collecting plate. In some embodiments, the method further includes trapping the contaminant particles within the collecting plate. The contaminant particles are scooped by the mitt member and temporarily stored within the hole.

The disclosed embodiments of a collecting plate are formed with pocket openings that are able to capture the contaminant particles. The pocket openings and the cavities of the collecting plate increases the efficiency of the capture of the contaminant particles and lowers the chance of the contaminant particles being reflected back into the system and entering the processing chamber.

Accordingly, one aspect of the instant disclosure provides an ion implantation apparatus that comprises an ion source; an analyzer coupled to the ion source; an accelerator coupled to the analyzer; a process chamber configured to receive contaminant particles from the accelerator; and a collecting plate disposed between the accelerator and the process chamber. The collecting plate having a body having a plurality of holes respectively partially covered by a mitt member, wherein the mitt member defines a pocket opening, and wherein the mitt member and the hole cooperatively form a cavity.

In some embodiments, a material for the collecting plate includes graphite.

In some embodiments, a cross sectional view of the mitt member forms an arch shape and the mitt member has a dome shape.

In some embodiments, a cross sectional view of the mitt member forms a triangular shape and the mitt member has a pyramidal shape.

In some embodiments, a cross sectional view of the mitt member forms a triangular shape and the mitt member has a conical shape.

In some embodiments, a cross sectional view of the mitt member forms a quadrangular shape and the mitt member has a box shape.

In some embodiments, a height from a highest point of the mitt member to a bottom surface of the collecting plate ranges from about 3 mm to about 6 mm.

In some embodiments, a pitch between neighboring pocket openings ranges from about 3 mm to about 10 mm.

In some embodiments, a width of the hole ranges from about 3 mm to about 5 mm.

Accordingly, another aspect of the instant disclosure provides a collecting plate of an ion implantation apparatus that comprises a body having a plurality of holes arranged in an array, the plurality of holes configured to retain contaminant particles; and a plurality of mitt members respectively disposed over the plurality of holes. Each of the mitt members partially covering a corresponding hole and configured to catch the contaminant particles traveling at a speed and directing the contaminant particles towards a corresponding hole. A space between the mitt member and the hole forms an pocket opening. And, the hole and the mitt member forming a cavity.

In some embodiments, a thickness of the collecting plate ranges from about 10 mm to about 18 mm.

In some embodiments, a height from a highest point of the mitt member to a bottom surface of the collecting plate ranges from about 3 mm to about 6 mm.

In some embodiments, a pitch between neighboring pocket openings ranges from about 3 mm to about 10 mm.

In some embodiments, a width of the hole ranges from about 3 mm to about 5 mm.

In some embodiments, a cross sectional view of the mitt member forms an arch shape and the mitt member has a dome shape.

In some embodiments, a cross sectional view of the mitt member forms a triangular shape and the mitt member has a pyramidal shape.

In some embodiments, a cross sectional view of the mitt member forms a triangular shape and the mitt member has a conical shape.

In some embodiments, a cross sectional view of the mitt member forms a quadrangular shape and the mitt member has a box shape.

Accordingly, another aspect of the instant disclosure provides a method of capturing contaminant particle that comprises receiving a collecting plate, the collecting plate having a plurality of cavities, each of the cavities are formed by a hole in a body of the collecting plate and a mitt member of the collecting plate partially covering the hole, the mitt member having a pocket opening facing a direction of an ion beam from an accelerator; installing the collecting plate; generating an ion beam from an ion source; analyzing the ion beam using an analyzer; manipulating a speed of the ion beam using the accelerator; collecting contaminant particles from the ion beam using the collecting plate; and providing the ion beam to the process chamber.

In some embodiments, the method further comprises trapping the contaminant particles within the collecting plate, wherein the contaminant particles are scooped by the mitt member and temporarily stored within the cavity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An ion implantation apparatus, comprising:
an ion source;
an analyzer coupled to the ion source;
an accelerator coupled to the analyzer;
a process chamber; and
a collecting plate disposed between the accelerator and the process chamber, the collecting plate being configured to receive contaminant particles from the accelerator, the collecting plate comprising a body comprising a plurality of holes respectively partially covered by a corresponding one of a plurality of mitt members, wherein each of the plurality of mitt members defines a pocket opening, and wherein each of the plurality of mitt members and the corresponding one of the plurality of holes cooperatively form a cavity.

2. The apparatus of claim 1, wherein a material for the collecting plate includes graphite.

3. The apparatus of claim 1, wherein a cross sectional view of the mitt member forms an arch shape and the mitt member has a dome shape.

4. The apparatus of claim 1, wherein a cross sectional view of the mitt member forms a triangular shape and the mitt member has a pyramidal shape.

5. The apparatus of claim 1, wherein a cross sectional view of the mitt member forms a triangular shape and the mitt member has a conical shape.

6. The apparatus of claim 1, wherein a cross sectional view of the mitt member forms a quadrangular shape and the mitt member has a box shape.

7. The apparatus of claim 1, wherein a height from a highest point of the mitt member to a bottom surface of the collecting plate ranges from about 3 mm to about 6 mm.

8. The apparatus of claim 1, wherein a pitch between neighboring holes ranges from about 3 mm to about 10 mm.

9. The apparatus of claim 1, wherein a width of the hole ranges from about 3 mm to about 5 mm.

* * * * *